(12) United States Patent
Chen

(10) Patent No.: US 6,766,852 B1
(45) Date of Patent: Jul. 27, 2004

(54) HEATSINK PLATE

(76) Inventor: Li-Chuan Chen, 58, Ma Yuan West St., Taichung (TW)

( * ) Notice: Subject to any disclaimer, the term of this patent is extended or adjusted under 35 U.S.C. 154(b) by 0 days.

(21) Appl. No.: 10/377,518

(22) Filed: Feb. 26, 2003

(51) Int. Cl.[7] .............................................. H05K 7/20
(52) U.S. Cl. ...................... 165/185; 165/78; 165/80.3; 257/722; 361/704
(58) Field of Search ............................ 165/80.3, 185, 165/78, 182, 76; 174/16.3; 257/722; 361/704

(56) References Cited

U.S. PATENT DOCUMENTS

| | | | | |
|---|---|---|---|---|
| 2,419,233 A | * | 4/1947 | Spender | 165/80.3 |
| 2,419,234 A | * | 4/1947 | Holihan | 165/185 |
| 2,434,676 A | * | 1/1948 | Spender | 165/182 |
| 4,308,915 A | * | 1/1982 | Sanders et al. | 165/166 |
| 4,681,155 A | * | 7/1987 | Kredo | 165/76 |
| 4,848,450 A | * | 7/1989 | Lapkowsky | 165/76 |
| 5,529,120 A | * | 6/1996 | Howard et al. | 174/16.3 |
| 6,386,275 B1 | * | 5/2002 | Kuo et al. | 165/80.3 |
| 6,401,810 B1 | * | 6/2002 | Kuo et al. | 165/185 |
| 6,651,733 B1 | * | 11/2003 | Horng et al. | 165/80.3 |

* cited by examiner

*Primary Examiner*—Leonard R. Leo

(57) ABSTRACT

A heatsink plate includes a bottom wall and two opposite side walls. Each of the two opposite side walls has a first side, a second side, and a concave shoulder located between the first side and the second side. The second side of each of the two opposite side walls has two opposite ends each formed with a positioning ear. Thus, by design of the positioning ear and the concave shoulder, the heatsink plates are closely combined with each other rigidly and stably without any gap being defined therebetween, so that the airflow passes through the combined heatsink plates more conveniently, so as to reduce the air shear force and increase the air flow rate of the ventilating fan, thereby enhancing the heat dissipation effect.

10 Claims, 5 Drawing Sheets

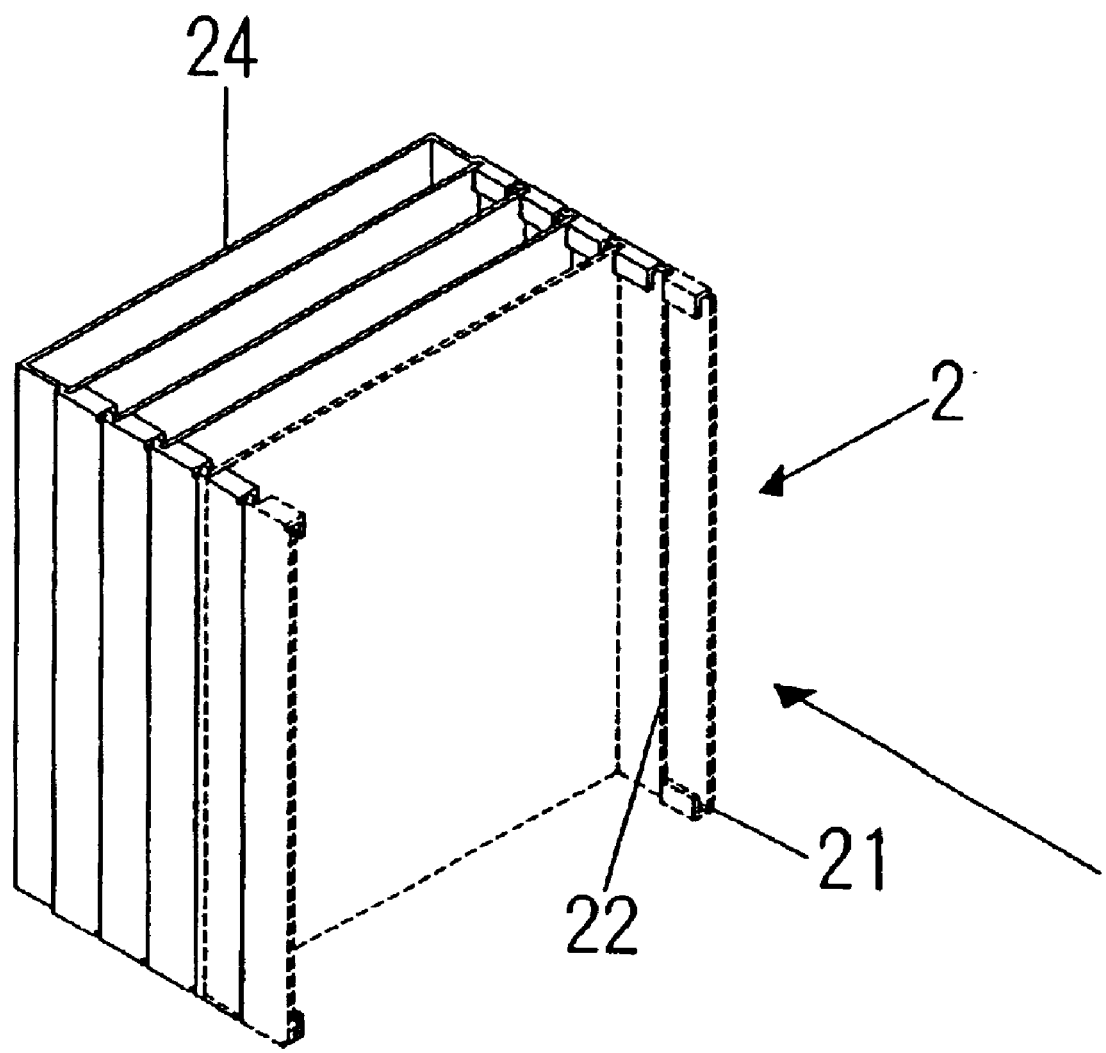
F I G. 4

HEATSINK PLATE

BACKGROUND OF THE INVENTION

1. Field of the Invention

The present invention relates to a heatsink plate, and more particularly to a heatsink plate having an excellent heat dissipation effect.

2. Description of the Related Art

A conventional heatsink plate 1 in accordance with the prior art shown in FIG. 1 has a sheet shape, and has a top portion 11 formed with a plurality of openings 111 and a bottom portion 12 provided with a horizontal piece 121. The conventional heatsink plate 1 has two ends each formed with two opposite corner pieces 13. In such a manner, when the conventional heatsink plates 1 are combined, the corner pieces 13 are connected so that the conventional heatsink plates 1 are combined with each other.

However, due to design of the openings 111, the horizontal piece 121 and the corner pieces 13, the combined heatsink plates 1 present an uneven state, thereby forming gaps therebetween, so that the airflow cannot pass through the combined heatsink plates 1 conveniently, so as to increase the air shear force and decrease the air flow rate of the ventilating fan mounted on the combined heatsink plates 1, thereby decreasing the heat dissipation effect.

SUMMARY OF THE INVENTION

The present invention is to mitigate and/or obviate the disadvantage of the conventional heatsink plate.

The primary objective of the present invention is to provide a heatsink plate having an excellent heat dissipation effect.

Another objective of the present invention is to provide a heatsink plate, wherein by design of the positioning ear and the concave shoulder, the heatsink plates are closely combined with each other rigidly and stably without any gap being defined therebetween, so that the airflow passes through the combined heatsink plates more conveniently, so as to reduce the air shear force and increase the air flow rate of the ventilating fan mounted on the combined heatsink plates, thereby enhancing the heat dissipation effect.

A further objective of the present invention is to provide a heatsink plate, wherein the bottom wall and each of the two opposite side walls of the heatsink plate have a planar shape, so that the contact area between the airflow and the combined heatsink plates are increased, thereby enhancing the heat dissipation effect.

In accordance with the present invention, there is provided a heatsink plate, comprising a bottom wall and two opposite side walls, wherein:

each of the two opposite side walls has a first side connected to the bottom wall and a second side located opposite to the bottom wall;

each of the two opposite side walls is formed with a bent concave shoulder located between the first side and the second side; and the second side of each of the two opposite side walls has two opposite ends each formed with a positioning ear.

Further benefits and advantages of the present invention will become apparent after a careful reading of the detailed description with appropriate reference to the accompanying drawings.

BRIEF DESCRIPTION OF THE DRAWINGS

FIG. 4 is a perspective assembly view of the heatsink plates in accordance with the preferred embodiment of the present invention.

DETAILED DESCRIPTION OF THE INVENTION

Figure 1:
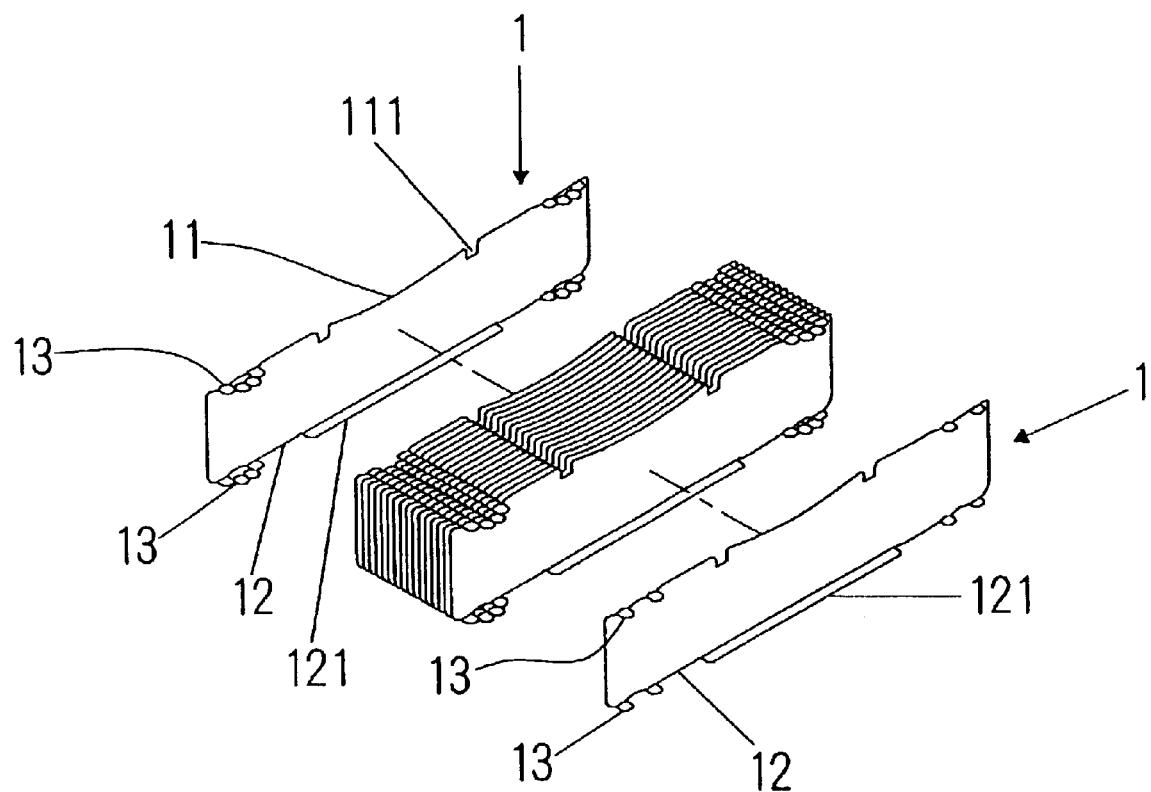
FIG. 1 is an exploded perspective view of a conventional heatsink plate in accordance with the prior art.
Figure 2:
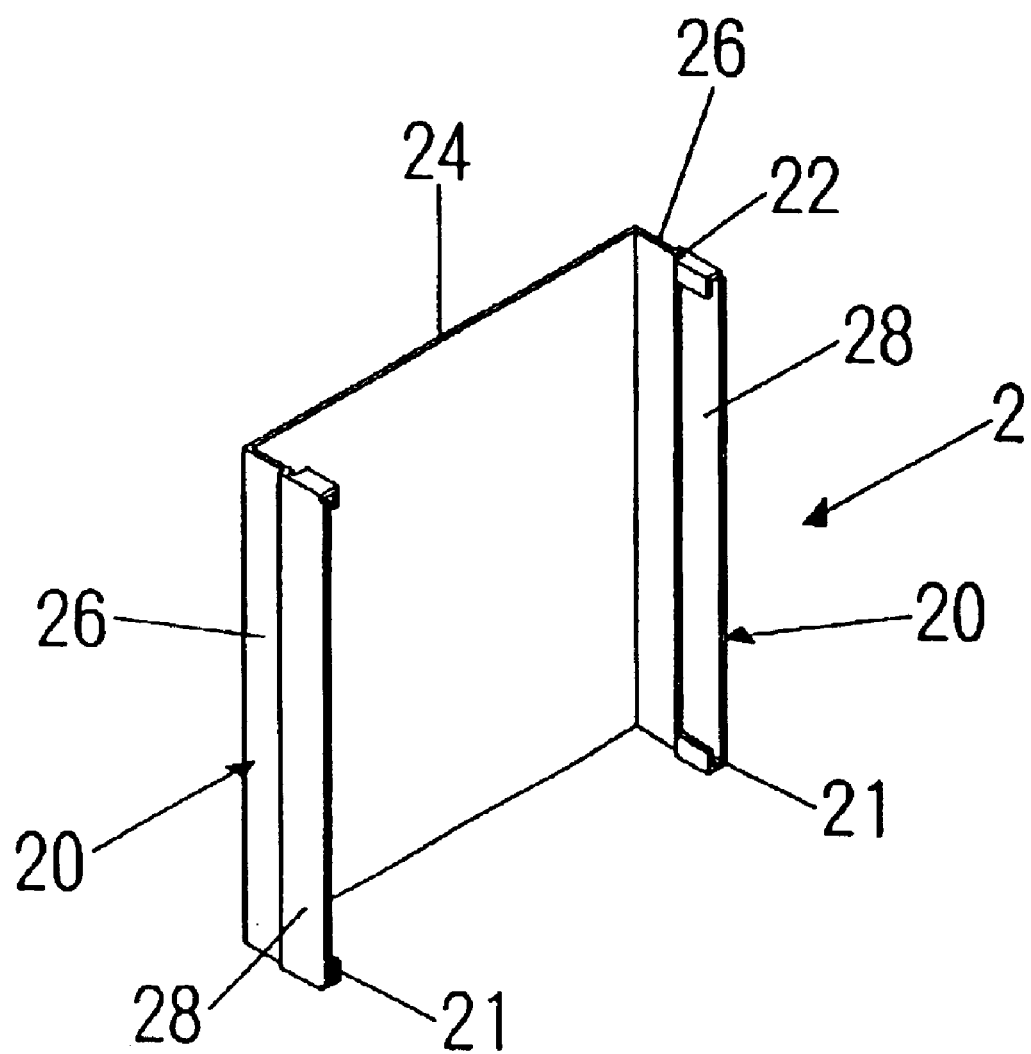
FIG. 2 is a perspective view of a heatsink plate in accordance with the preferred embodiment of the present invention.

Referring to the drawings and initially to FIG. 2, a heatsink plate 2 in accordance with the preferred embodiment of the present invention is substantially U-shaped, and has a bottom wall 24 and two opposite side walls 20. Preferably, the heatsink plate 2 is integrally formed with the bottom wall 24 and the two opposite side walls 20.

The bottom wall 24 has a planar shape.

Each of the two opposite side walls 20 has a planar shape. Each of the two opposite side walls 20 has a first side 26 connected to the bottom wall 24 and a second side 28 located opposite to the bottom wall 24. The first side 26 of each of the two opposite side walls 20 has a width smaller than that of the second side 28. Each of the two opposite side walls 20 is formed with a bent concave shoulder 22 located between the first side 26 and the second side 28. The second side 28 of each of the two opposite side walls 20 has two opposite ends each formed with a positioning ear 21. Preferably, the positioning ear 21 of each of the two opposite side walls 20 is substantially L-shaped. Preferably, the positioning ears 21 of the two opposite ends of the second side 28 of each of the two opposite side walls 20 face toward each other.

Figure 3:
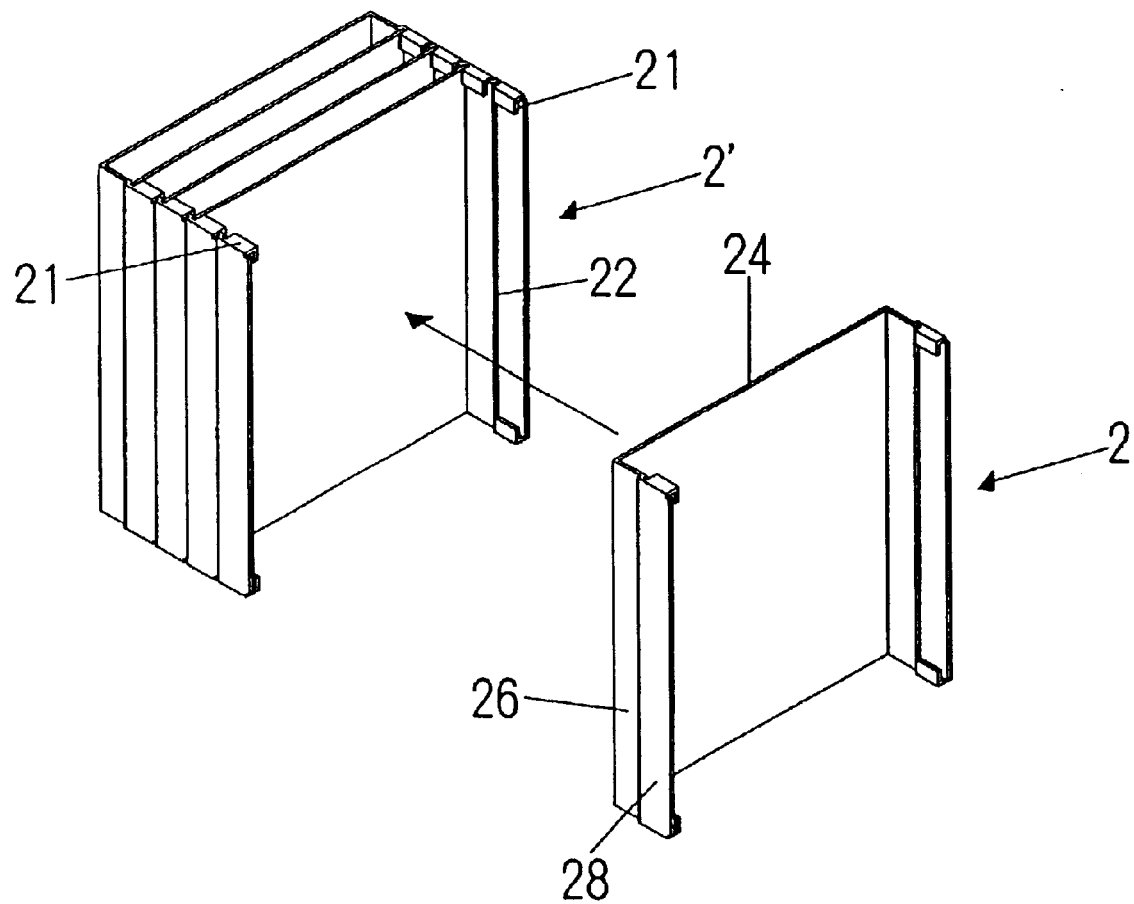
FIG. 3 is an exploded perspective view of the heatsink plates in accordance with the preferred embodiment of the present invention.
Figure 5:
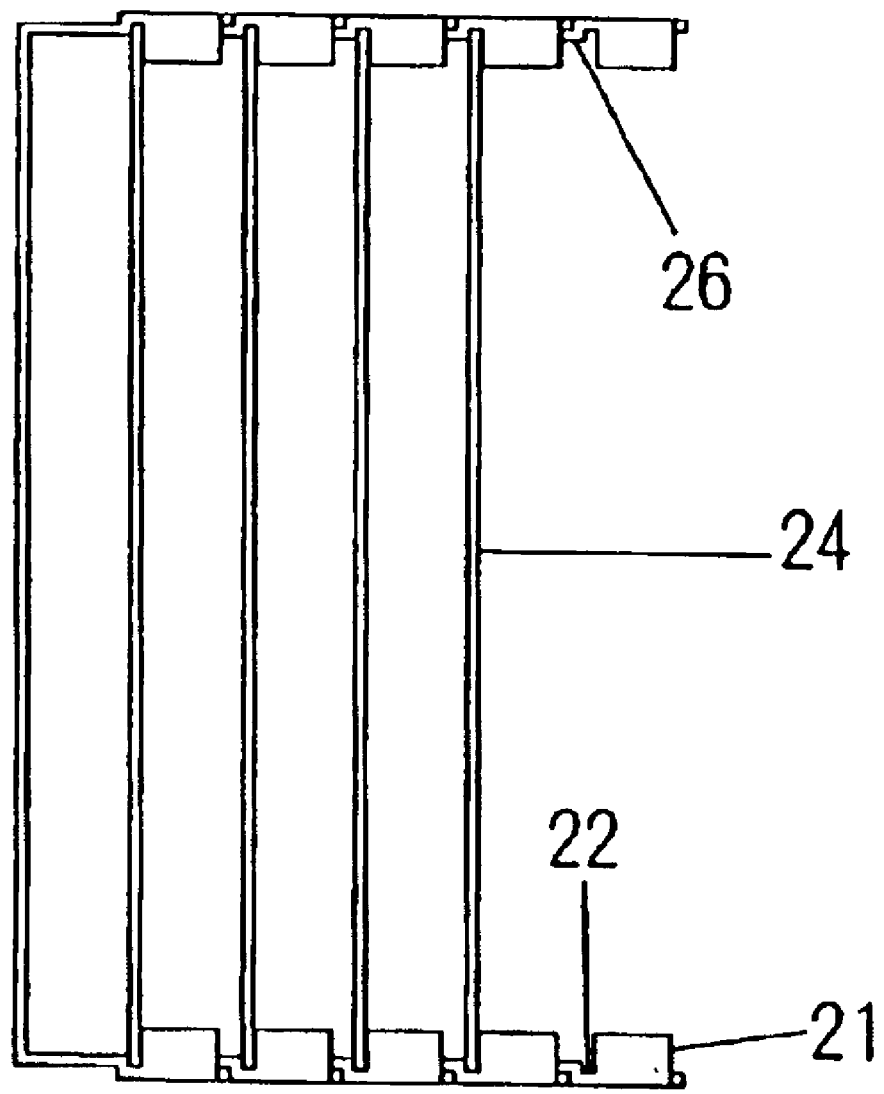
FIG. 5 is a top plan view of the heatsink plates as shown in FIG. 4.

In assembly, referring to FIGS. 3–5 with reference to FIG. 2, when a plurality of heatsink plates 2 are assembled, the first heatsink plate 2 is inserted into the second heatsink plate 2', with the bottom wall 24 of the first heatsink plate 2 being inserted into the positioning ears 21 of the second heatsink plate 2', so that the positioning ears 21 of the second heatsink plate 2' closely encompass the first side 26 of each of the two opposite side walls 20 of the first heatsink plate 2, and the concave shoulder 22 of each of the two opposite side walls 20 is closely rested on the bottom wall 24 of the first heatsink plate 2. Thus, the first heatsink plate 2 and the second heatsink plate 2' are closely combined with each other without any gap defined therebetween.

Accordingly, by design of the positioning ear 21 and the concave shoulder 22, the heatsink plates 2 are closely combined with each other rigidly and stably without any gap being defined therebetween, so that the airflow passes through the combined heatsink plates 2 more conveniently, so as to reduce the air shear force and increase the air flow rate of the ventilating fan mounted on the combined heatsink plates 2, thereby enhancing the heat dissipation effect. In addition, the bottom wall 24 and each of the two opposite side walls 20 of the heatsink plate 2 have a planar shape, so that the contact area between the airflow and the combined heatsink plates 2 are increased, thereby enhancing the heat dissipation effect.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A heatsink plate, comprising a bottom wall and two opposite side walls, wherein:

each of the two opposite side walls has a first side connected to the bottom wall and a second side located opposite to the bottom wall;

each of the two opposite side walls is formed with a bent concave shoulder located between the first side and the second side; and the second side of each of the two opposite side walls has two opposite ends each formed with a positioning ear.

2. The heatsink plate in accordance with claim 1, wherein the heatsink plate is substantially U-shaped.

3. The heatsink plate in accordance with claim 1, wherein the heatsink plate is integrally formed with the bottom wall and the two opposite side walls.

4. The heatsink plate in accordance with claim 1, wherein the bottom wall has a planar shape.

5. The heatsink plate in accordance with claim 1, wherein each of the two opposite side walls has a planar shape.

6. The heatsink plate in accordance with claim 1, wherein the first side of each of the two opposite side walls has a width smaller than that of the second side.

7. The heatsink plate in accordance with claim 1, wherein the positioning ear of each of the two opposite side walls is substantially L-shaped.

8. The heatsink plate in accordance with claim 1, wherein the positioning ears of the two opposite ends of the second side of each of the two opposite side walls fade toward each other.

9. The heatsink plate in accordance with claim 1, wherein a first heatsink plate is inserted into a second heatsink plate, with the bottom wall of the first heatsink plate being inserted into the positioning ears of the second heatsink plate, so that the positioning ears of the second heatsink plate encompass the first side of each of the two opposite side walls of the first heatsink plate, and the concave shoulder of each of the two opposite side walls is rested on the bottom wall of the first heatsink plate.

10. The heatsink plate in accordance with claim 9, wherein the first heatsink plate and the second heatsink plate are closely combined with each other without any gap defined therebetween.

* * * * *